US007661180B2

(12) United States Patent
Mita

(10) Patent No.: US 7,661,180 B2
(45) Date of Patent: Feb. 16, 2010

(54) METHOD OF MANUFACTURING A PIEZOELECTRIC ACTUATOR AND LIQUID EJECTION HEAD

(75) Inventor: Tsuyoshi Mita, Ashigarakami-gun (JP)

(73) Assignee: Fujifilm Corporation, Tokyo (JP)

( * ) Notice: Subject to any disclaimer, the term of this patent is extended or adjusted under 35 U.S.C. 154(b) by 379 days.

(21) Appl. No.: 11/637,149

(22) Filed: Dec. 12, 2006

(65) Prior Publication Data

US 2007/0130740 A1 Jun. 14, 2007

(30) Foreign Application Priority Data

Dec. 13, 2005 (JP) ............................ 2005-359276

(51) Int. Cl.
*H01L 41/053* (2006.01)
*H04R 17/10* (2006.01)

(52) U.S. Cl. .......................... 29/25.35; 29/842; 29/831; 310/324

(58) Field of Classification Search ................ 29/25.35, 29/890.1, 842, 831, 846; 310/311, 321, 324; 347/68–72
See application file for complete search history.

(56) References Cited

U.S. PATENT DOCUMENTS 5,160,870 A * 11/1992 Carson et al. ........... 310/324 X
5,719,607 A * 2/1998 Hasegawa et al. ............. 347/70
2005/0012786 A1 1/2005 Kobayashi
2005/0012790 A1 1/2005 Kobayashi et al.

FOREIGN PATENT DOCUMENTS

| | | | | | |
|---|---|---|---|---|---|
| GB | 2339724 | A | | 2/2000 | |
| JP | 06206317 | A | * | 7/1994 | .............. 347/68 X |
| JP | 2000-37877 | A | | 2/2000 | |
| JP | 2001-152361 | A | | 6/2001 | |
| JP | 2005-35013 | A | | 2/2005 | |
| JP | 2005-35018 | A | | 2/2005 | |

* cited by examiner

*Primary Examiner*—A. Dexter Tugbang
(74) *Attorney, Agent, or Firm*—Birch, Stewart, Kolasch & Birch, LLP

(57) ABSTRACT

The method of manufacturing a piezoelectric actuator includes the steps of: carrying out a first heat treatment of a diaphragm of stainless steel containing iron, chromium and aluminum, in a gas containing oxygen, so as to form an aluminum oxide film on a first surface of the diaphragm and form a chromium oxide film between the aluminum oxide film and the first surface of the diaphragm; forming a lower electrode on the aluminum oxide film; forming a piezoelectric body on a surface of the lower electrode reverse to a surface of the lower electrode on which the chromium oxide film and the aluminum oxide film are formed; forming an upper electrode on a surface of the piezoelectric body reverse to a surface of the piezoelectric body on which the lower electrode is formed; and calcining the piezoelectric body by carrying out a second heat treatment of the diaphragm with which the piezoelectric body is provided.

7 Claims, 8 Drawing Sheets

FIG.8

| | Cr CONTENT (WT%) | Al CONTENT (WT%) | HEAT TREATMENT TEMPERATURE (°C) | Fe DIFFUSION EVALUATION |
|---|---|---|---|---|
| SUS304 | 18~20 | - | 600 | poor |
| SUS430 | 16~18 | - | 600 | poor |
| A | 18~20 | 2.5 | 600 | good |
| A | 18~20 | 2.5 | 800 | poor |
| B | 18 | 2.98 | 800 | good |
| C | 19~21 | 4.5~6 | 800 | good |
| D | 19.5~20.5 | 4.8~5.25 | 800 | good |

good: NO DIFFUSION
poor: DIFFUSION

METHOD OF MANUFACTURING A PIEZOELECTRIC ACTUATOR AND LIQUID EJECTION HEAD

BACKGROUND OF THE INVENTION

1. Field of the Invention

The present invention relates to a piezoelectric actuator, a method of manufacturing a liquid ejection head, a liquid ejection head and an image forming apparatus, and more particularly, to technology for manufacturing a liquid ejection head which ejects liquid from a nozzle and a structure of a liquid ejection head.

2. Description of the Related Art

An inkjet recording apparatus having a head (i.e., a liquid ejection head) is known in which the wall surface of a pressure chamber is deformed owing to displacement of a piezoelectric element and the ink inside the pressure chamber is pressurized, thereby causing an ink droplet to be ejected from a nozzle connected to the pressure chamber.

In recent years, since higher integration have been necessary in heads used in inkjet recording apparatuses, then various design modifications have been contrived in respect of the structure and manufacture of piezoelectric elements which generate the ejection force, in order to achieve high integration of heads and ensure high reliability and high performance.

Japanese Patent Application Publication No. 2001-152361 discloses the structure of a thick piezoceramic film formed by a gas deposition method. In this structure of a thick piezoceramic film, film formation based on the gas deposition method is carried out after forming an intermediate film on a substrate, thereby reducing the substrate damage and preventing reduction of the mechanical strength of the laminated structural body formed by the piezoceramic film and the substrate.

Japanese Patent Application Publication Nos. 2005-35013 and 2005-35018 disclose a method of manufacturing a liquid movement device in which a diaphragm is bonded to an ink storage chamber and a piezoelectric film is formed thereon and annealed, thereby producing a piezoelectric body having a thin film thickness. Thus, even if the piezoelectric body is driven at a low drive voltage, sufficient pressure is applied to the liquid inside the liquid chamber and the liquid can be moved to the exterior from the liquid chamber.

Japanese Patent application publication No. 2000-37877 discloses a method of manufacturing an actuator in which an oxidation resistant film (a metal oxide film) is formed on a diaphragm of a thin metal plate by the vacuum deposition method, prior to a calcination step of calcining a piezoelectric body at a high temperature, in order to prevent changes of properties and shape of the diaphragm in the calcination step.

However, in a case where an actuator (piezoelectric actuator) includes: a diaphragm (substrate) using metal containing iron (Fe) such as stainless steel; and a piezoelectric body (piezoelectric element) made of PZT (including Pb(Zr—Ti)$O_3$ (i.e., lead titanate zirconate)), or the like, the iron contained in the diaphragm diffuses into the piezoelectric body owing to the high temperature (600° C. or higher) during deposition of the piezoelectric body or during the post-annealing process, and therefore it is difficult to satisfactorily obtain the required characteristics in the actuator. Moreover, from the viewpoint of preventing warpage of the diaphragm due to the heat treatment process, it is necessary to harmonize the coefficients of linear expansion of the diaphragm and the piezoelectric body.

In the invention disclosed in Japanese Patent Application Publication No. 2001-152361, an intermediate film made of $SiO_2$, $TiO_2$, $ZrO_2$, or the like, is formed on the substrate (principally, a fragile material such as silicon), in order to prevent substrate damage or decline in mechanical strength during film deposition by a gas deposition method. However, the presence of an intermediate film of this kind is undesirable from the viewpoint of preventing warpage of the substrate, and moreover, it may cause manufacturing costs to increase. Furthermore, the thickness of the diaphragm is increased in dependence upon the film thickness of the intermediate film, and there is a possibility that the amount of displacement of the diaphragm declines.

In the inventions disclosed in Japanese Patent Application Publication Nos. 2005-35013 and 2005-35018, an annealing process is carried out for several hours in a high-temperature atmosphere of 600° C. to 750° C. (AD method: Aerosol Deposition method) or 600° C. to 1200° C. (sol gel method), and therefore, the iron contained in the stainless steel diaphragm diffuses into the piezoelectric elements and degrades the performance of the piezoelectric elements.

In the invention disclosed in Japanese Patent Application Publication No. 2000-37877, the oxidation resistant film (metal oxide film) formed on the diaphragm constituted by a thin metal plate does not have a minute structure, and hence it is difficult to prevent diffusion of iron contained in the diaphragm into the piezoelectric elements. Moreover, there is a possibility that the amount of displacement of the diaphragm is reduced owing to the thickness of the oxidation resistant film formed by the vacuum deposition method, and furthermore, it may cause manufacturing costs to increase.

SUMMARY OF THE INVENTION

The present invention has been contrived in view of the foregoing circumstances, an object thereof being to provide a piezoelectric actuator, a method of manufacturing a liquid ejection head, a liquid ejection head and an image forming apparatus, in order to prevent a metal element contained in the substrate from diffusing into a piezoelectric element and ensure the performance and reliability of the piezoelectric element in such a manner that desirable liquid ejection can be achieved.

In order to attain the aforementioned object, the present invention is directed to a method of manufacturing a piezoelectric actuator, comprising the steps of: carrying out a first heat treatment of a diaphragm of stainless steel containing iron, chromium and aluminum, in a gas containing oxygen, so as to form an aluminum oxide film on a first surface of the diaphragm and form a chromium oxide film between the aluminum oxide film and the first surface of the diaphragm; forming a lower electrode on the aluminum oxide film; forming a piezoelectric body on a surface of the lower electrode reverse to a surface of the lower electrode on which the chromium oxide film and the aluminum oxide film are formed; forming an upper electrode on a surface of the piezoelectric body reverse to a surface of the piezoelectric body on which the lower electrode is formed; and calcining the piezoelectric body by carrying out a second heat treatment of the diaphragm with which the piezoelectric body is provided.

According to this aspect of the present invention, the aluminum oxide film is formed on the surface of the diaphragm (the aluminum oxide film grows and this growth terminates when the aluminum has been expended by the oxidation reaction) and the chromium oxide film is formed between the aluminum oxide film and the diaphragm (the chromium oxide film grows between the aluminum oxide film and the diaphragm (underlying substrate)) by carrying out heat treatment of the diaphragm in a gas containing oxygen (for example, in the atmosphere) in the oxide film formation process. Therefore it is possible to prevent diffusion of the iron contained in the diaphragm, into the piezoelectric body during calcining of the piezoelectric body, because of effects of the two-layer metal oxide film including the chromium oxide film and the aluminum oxide film, and hence it is possible to prevent deterioration in the performance of the piezoelectric body or decline in the reliability of the piezoelectric body.

The piezoelectric actuator includes an actuator comprising: a piezoelectric element (piezoelectric body) made of PZT (lead zirconate titanate), PVDF (vinylidene polyfluoride), or the like; and a diaphragm which is deformed in accordance with the deflection deformation of the piezoelectric element, wherein a mechanical displacement (energy) is yielded by deforming the diaphragm in accordance with a drive signal which is applied to the electrode(s) provided with the piezoelectric element.

Preferably, the temperature conditions during forming the aluminum oxide film and the chromium oxide film is set in such a manner that the temperature is not less than 600° C. and not more than 1200° C.

Preferably, the first heat treatment of the diaphragm is carried out in the gas, in such a manner that an aluminum oxide film is also formed on a second surface of the diaphragm reverse to the first surface and a chromium oxide film is also formed between the aluminum oxide film and the second surface of the diaphragm.

Preferably, the diaphragm has a chromium content of 18 weight percent or above, and an aluminum content of 2.5 weight percent or above; and the piezoelectric body is calcined by carrying out the second heat treatment under temperature conditions of not less than 600° C. and below 800° C.

According to this aspect of the present invention, the two-layer metal oxide film which includes the chromium oxide film and the aluminum oxide film and is effective for preventing diffusion of iron into the piezoelectric body, is formed on the diaphragm.

Preferably, the diaphragm has a chromium content of 18 weight percent or above, and an aluminum content of 2.98 weight percent or above; and the piezoelectric body is calcined by carrying out the second heat treatment under temperature conditions of not less than 800° C.

According to this aspect of the present invention, the two-layer metal oxide film which includes the chromium oxide film and the aluminum oxide film and is effective for preventing diffusion of iron into the piezoelectric body is formed on the diaphragm, the chromium content in the diaphragm is 18 wt % or above, and the aluminum content in the diaphragm is 2.98 wt % or above. Hence, it is possible to prevent deterioration in the performance of the piezoelectric body or decline in the reliability of the piezoelectric body, even when the piezoelectric body is calcined at 800° C. or above.

By setting higher temperature conditions for the calcinations of the piezoelectric element, the piezoelectric actuator having a higher electrical-to-mechanical conversion constant (piezoelectric d constant), which is desirable as an ejection force generating element, is formed.

Preferably, the chromium oxide film contains chromium oxide and the aluminum oxide film contains aluminum oxide.

According to this aspect of the present invention, a metal oxide film that is suitable for preventing diffusion of iron into the piezoelectric body during the calcination of the piezoelectric body is formed between the diaphragm and the piezoelectric body.

Since oxides of the metal elements (chromium and aluminum) contained in the diaphragm (substrate) are generated on the surface of the diaphragm by oxidation reaction, then the metal oxide film having a smaller thickness can be formed on the surface of the diaphragm, in comparison with a mode where a metal oxide film is provided on the surface of the diaphragm. This metal oxide film has two-layer structure (i.e., structure in which the chromium oxide film is grown between the aluminum oxide film and the diaphragm).

Preferably, the thickness of the two-layer metal oxide film including the chromium oxide film and the aluminum oxide film (the total thickness of the two layers) is 1.0 μm or less, in order not to affect the amount of deformation of the diaphragm.

Preferably, the diaphragm includes a ferrite stainless steel substrate.

According to this aspect of the present invention, by using ferrite stainless steel for the diaphragm, it is possible to harmonize the coefficients of linear expansion of the diaphragm and the piezoelectric body (piezoelectric element) formed on the diaphragm, and therefore warpage of the diaphragm during the calcination of the piezoelectric element is reduced.

Preferably, the diaphragm has a coefficient of linear expansion of $8\times10^{-6}$ to $12\times10^{-6}$(° C.$^{-1}$), and more preferably, the diaphragm has a coefficient of linear expansion of $10\times10^{-6}$ (° C.$^{-1}$).

Preferably, the piezoelectric body is formed by aerosol deposition.

A plurality of the piezoelectric bodies may be provided; the piezoelectric bodies may be formed selectively only at prescribed positions on the diaphragm (positions corresponding to pressure chambers); and the piezoelectric bodies may be provided by depositing a piezoelectric body over the whole surface of the diaphragm and then dividing the piezoelectric body into regions corresponding to pressure chambers.

In order to attain the aforementioned object, the present invention is also directed to a method of manufacturing a liquid ejection head, comprising the steps of: bonding together a diaphragm made of a stainless steel substrate containing iron, chromium and aluminum, and a pressure chamber formation substrate which has a space for a pressure chamber and is made of a stainless steel substrate containing chromium and aluminum, by diffusion bonding, in such a manner that a structural body including the diaphragm and the pressure chamber formation substrate is formed; carrying out a first heat treatment of the structural body so as to form an aluminum oxide film on a surface of the structural body and form a chromium oxide film between the aluminum oxide film and the structural body; forming a lower electrode on the aluminum oxide film; forming a piezoelectric body on a surface of the lower electrode reverse to a surface of the lower electrode on which the chromium oxide film and the aluminum oxide film are formed; forming an upper electrode on a surface of the piezoelectric body reverse to a surface of the piezoelectric body on which the lower electrode is formed; and calcining the piezoelectric body by carrying out a second heat treatment of the structural body in which the piezoelectric body is formed on the diaphragm.

According to this aspect of the present invention, diffusion of the iron contained in the diaphragm into the piezoelectric body during the calcination of the piezoelectric body, is prevented by the two-layer metal oxide film including the chromium oxide film and the aluminum oxide film formed on the surface of the diaphragm, and therefore deterioration in the performance of the piezoelectric body and decline in the reliability of the piezoelectric body is prevented. Moreover, the metal oxide film formed on the surface of the pressure chamber serves as a protective film that protects the pressure chamber from liquid accommodated in the pressure chamber.

Furthermore, by bonding the diaphragm and the pressure chamber formation substrate according to diffusion bonding, there is no necessity of adhesive for forming the structural body including the diaphragm and the pressure chamber formation substrate, and hence the manufacturing process can be simplified.

Preferably, the diffusion bonding of the diaphragm and the pressure chamber formation substrate is carried out under the temperature conditions where the temperature is not less than 900° C. and not more than 1100° C.

Preferably, each of the diaphragm and the pressure chamber formation substrate includes a ferrite stainless steel substrate.

According to this aspect of the present invention, the coefficients of linear expansion of the diaphragm and the pressure chamber formation substrate are substantially the same, and therefore it is possible to reduce warpage of the diaphragm and the pressure chamber formation substrate due to a high temperature during calcination of the piezoelectric body. Moreover, it is also possible to prevent detachment of the bonding part due to a heat treatment (for example, calcination of the piezoelectric element) after bonding.

Preferably, the pressure chamber formation substrate is formed by stacking and bonding a plurality of substrates together by diffusion bonding.

As a mode of forming the pressure chamber formation substrate by stacking together a plurality of substrates, there is a mode in which a plurality of substrates previously formed with openings for a pressure chamber, and the like, are prepared, and then these substrates are stacked together while being mutually aligned in position. It is also possible to manufacture the structural body (laminated body) including the pressure chamber and the diaphragm, by means of one process which combines the step of bonding together the substrates constituting the laminated structure of the pressure chamber formation substrate, and the step of bonding the pressure chamber formation substrate with the diaphragm.

In order to attain the aforementioned object, the present invention is also directed to a liquid ejection head comprising a piezoelectric actuator manufactured by one of the above-mentioned methods of manufacturing a piezoelectric actuator.

According to this aspect of the present invention, it is possible to obtain a liquid ejection head which is capable of achieving desirable liquid ejection and which guarantees high performance and high reliability, without passing through complicated steps.

The liquid ejection head may be a line type head having a row of nozzles of a length corresponding to the full width of a recording medium (the width of the possible image formation region of a recording medium), or a serial head which uses a short head having a row of nozzles of a length that does not reach the full width of a recording medium, and which scans in the breadthways direction of the recording medium.

A line type of liquid ejection head may be formed to a length corresponding to the full width of a recording medium by jointing short heads each having a row of nozzles which does not reach a length corresponding to the full width of a recording medium, in a staggered matrix fashion.

The liquid may be ink used in an inkjet recording apparatus, a chemical solution such as a resist forming liquid, a treatment liquid, or the like. The liquid has properties (such as viscosity) which allow the liquid to be ejected from the nozzle provided in the liquid ejection head.

In order to attain the aforementioned object, the present invention is also directed to an image forming apparatus comprising a liquid ejection head including a piezoelectric actuator manufactured by one of the above-mentioned methods of manufacturing a piezoelectric actuator.

The image forming apparatus may be an inkjet recording apparatus which forms a desired image by ejecting ink toward a recording medium.

Moreover, the term "recording medium" denotes a medium on which liquid ejected from an ejection hole is deposited, and includes various types of media, irrespective of material and size, such as continuous paper, cut paper, sealed paper, resin sheets such as OHP sheets, film, cloth, and other materials.

Furthermore, the term "image" denotes an image such as a photograph, a picture, text in the form of a character and a symbol, shapes such as a mask pattern formed on a substrate, or a wiring pattern formed on a wiring substrate, or the like.

In order to attain the aforementioned object, the present invention is also directed to an image forming apparatus comprising a liquid ejection head manufactured by one of the above-mentioned methods of manufacturing a liquid ejection head.

According to the present invention, a chromium oxide film is formed on a surface of a diaphragm, a aluminum oxide film is formed on the chromium oxide film, and the metal oxide film including the chromium oxide film and the aluminum oxide film serves to prevent iron contained in the diaphragm from diffusing into a piezoelectric body during calcination of the piezoelectric body. Therefore, it is possible to prevent deterioration of the performance of the piezoelectric body and decline in the reliability of the piezoelectric body. Furthermore, by using ferrite stainless steel for the diaphragm, the warpage of the diaphragm due to heat during the calcination of the piezoelectric body is prevented.

BRIEF DESCRIPTION OF THE DRAWINGS

The nature of this invention, as well as other objects and benefits thereof, is explained in the following with reference to the accompanying drawings, in which like reference characters designate the same or similar parts throughout the figures and wherein:

FIG. 8 is a diagram showing experimental results of an experiment relating to diffusion of iron into the piezoelectric bodies.

DETAILED DESCRIPTION OF THE PREFERRED EMBODIMENTS

General Composition of Inkjet Recording Apparatus

Figure 1:
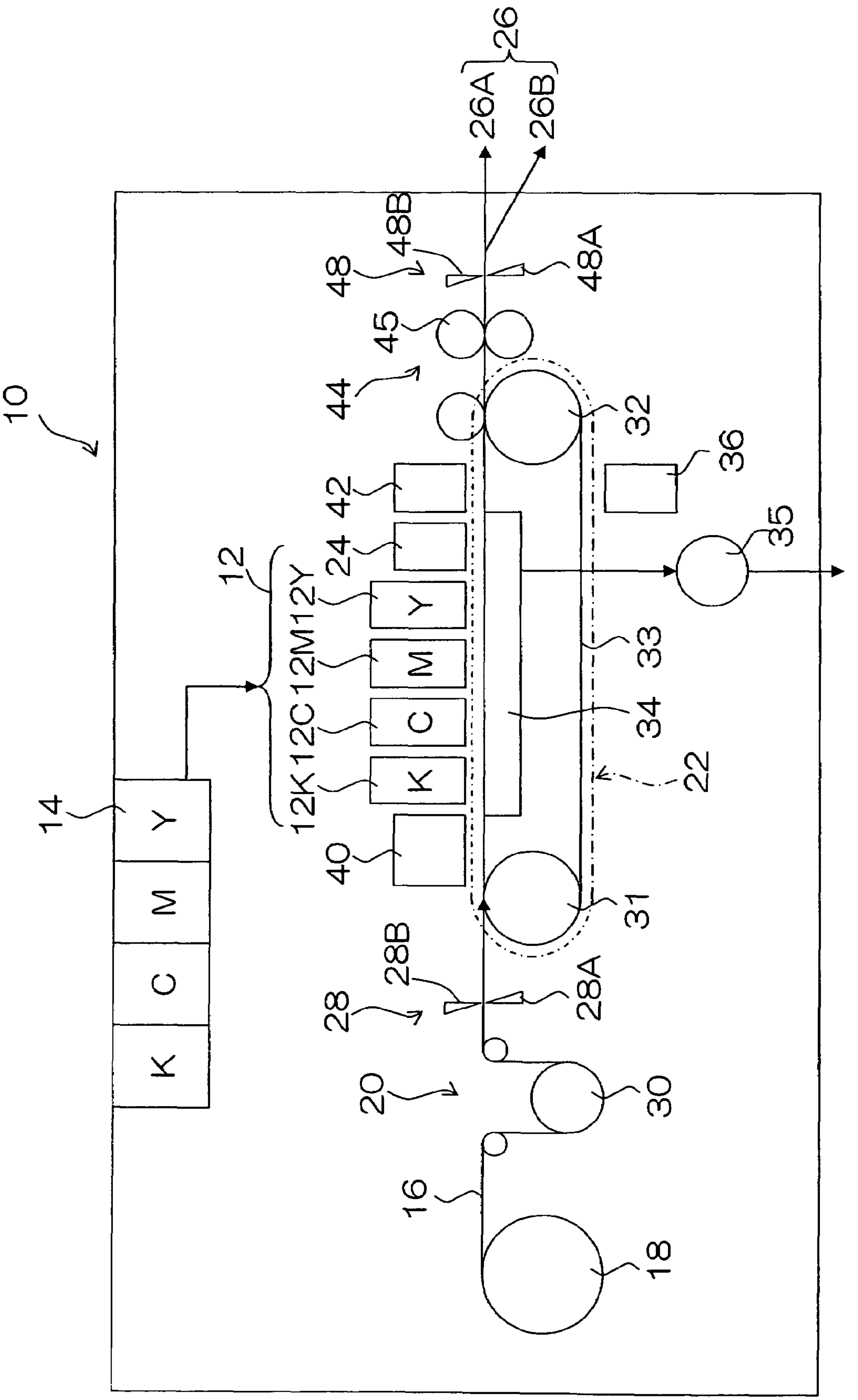
FIG. 1 is a general schematic drawing of an inkjet recording apparatus equipped with a head according to an embodiment of the present invention.
Figure 2:
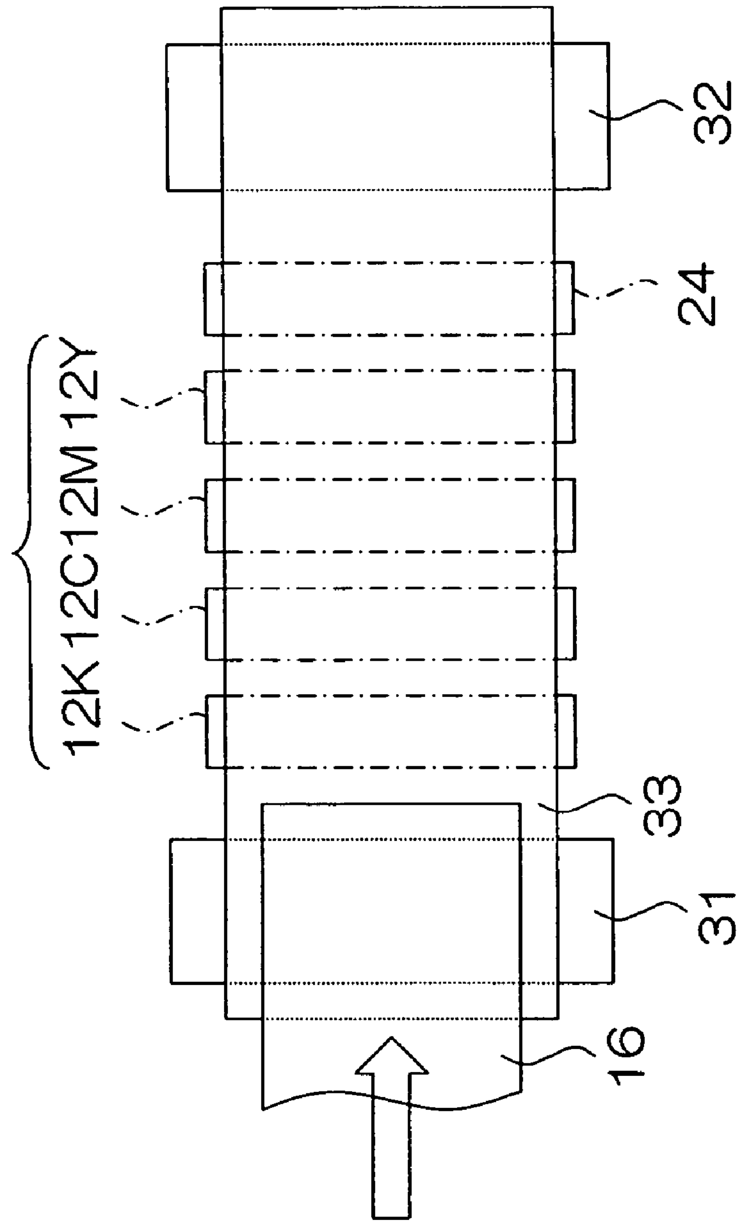
FIG. 2 is a principal plan diagram showing the peripheral area of a print unit in the inkjet recording apparatus shown in FIG. 1.

FIG. 1 is a general schematic drawing showing an embodiment of an inkjet recording apparatus according to an embodiment of the present invention. As shown in FIG. 1, the inkjet recording apparatus 10 comprises: a printing unit 12 having a plurality of heads 12K, 12C, 12M, and 12Y for ink colors of black (K), cyan (C), magenta (M), and yellow (Y), respectively; an ink storing and loading unit 14 for storing inks of K, C, M and Y to be supplied to the print heads 12K, 12C, 12M, and 12Y; a paper supply unit 18 for supplying recording paper 16; a decurling unit 20 for removing curl in the recording paper 16 supplied from the paper supply unit 18; a suction belt conveyance unit 22 disposed facing the nozzle faces (ink-droplet ejection faces) of the heads 12K, 12C, 12M, 12Y, for conveying the recording paper 16 (recording medium) while keeping the recording paper 16 flat; a print determination unit 24 for reading the printed result produced by the printing unit 12; and a paper output unit 26 for outputting an image-printed recording paper (printed matter) to the exterior.

In FIG. 1, a magazine for rolled paper (continuous paper) is shown as an embodiment of the paper supply unit 18; however, more magazines with paper differences such as paper width and quality may be jointly provided. Moreover, papers may be supplied with cassettes that contain cut papers loaded in layers and that are used jointly or in lieu of the magazine for rolled paper.

In the case of a configuration in which roll paper is used, a cutter 28 is provided as shown in FIG. 1, and the roll paper is cut to a desired size by the cutter 28. The cutter 28 has a stationary blade 28A whose length is not less than the width of the conveyor pathway of the recording paper 16, and a round blade 28B which moves along the stationary blade 28A. The stationary blade 28A is disposed on the reverse side of the printed surface of the recording paper 16, and the round blade 28B is disposed on the printed surface side across the conveyance path. When cut paper is used, the cutter 28 is not required.

In the case of a configuration in which a plurality of kinds of recording papers can be used, it is preferable that an information recording medium such as a bar code and a wireless tag containing information about the type of paper is attached to the magazine, and by reading the information contained in the information recording medium with a predetermined reading device, the type of paper to be used is automatically determined, and ink-droplet ejection is controlled so that the ink-droplets are ejected in an appropriate manner in accordance with the type of paper.

The recording paper 16 delivered from the paper supply unit 18 retains curl because of having been loaded in the magazine. In order to remove the curl, heat is applied to the recording paper 16 in the decurling unit 20 by a heating drum 30 in the direction opposite from the curl direction in the magazine. The heating temperature at this time is preferably controlled so that the recording paper 16 has a curl in which the surface on which the print is to be made is slightly round outward.

The decurled and cut recording paper 16 is delivered to the suction belt conveyance unit 22. The suction belt conveyance unit 22 has a configuration in which an endless belt 33 is set around rollers 31 and 32 so that the portion of the endless belt 33 facing at least the nozzle faces of the heads 12K, 12C, 12M, 12Y and the sensor face of the print determination unit 24 forms a plane.

The belt 33 has a width that is greater than the width of the recording paper 16, and a plurality of suction apertures (not shown) are formed on the belt surface. A suction chamber 34 is disposed in a position facing the sensor surface of the print determination unit 24 and the nozzle surface of the printing unit 12 on the interior side of the belt 33, which is set around the rollers 31 and 32, as shown in FIG. 1. The suction chamber 34 provides suction with a fan 35 to generate a negative pressure, and the recording paper 16 on the belt 33 is held by the suction. The belt 33 is driven in the clockwise direction in FIG. 1 by the motive force of a motor 88 shown in FIG. 5 (not shown in FIG. 1) being transmitted to at least one of the rollers 31 and 32, which the belt 33 is set around, and the recording paper 16 held on the belt 33 is conveyed from left to right in FIG. 1.

Since ink adheres to the belt 33 when a marginless print job or the like is performed, a belt-cleaning unit 36 is disposed in a predetermined position (a suitable position outside the printing area) on the exterior side of the belt 33. Although the details of the configuration of the belt-cleaning unit 36 are not shown, embodiments thereof include a configuration in which the belt 33 is nipped with cleaning rollers such as a brush roller and a water absorbent roller, an air blow configuration in which clean air is blown onto the belt 33, or a combination of these. In the case of the configuration in which the belt 33 is nipped with the cleaning rollers, it is preferable to make the line velocity of the cleaning rollers different than that of the belt 33 to improve the cleaning effect.

The inkjet recording apparatus 10 can comprise a roller nip conveyance mechanism in which the recording paper 16 is pinched and conveyed with nip rollers, instead of the suction belt conveyance unit 22. However, there is a drawback in the roller nip conveyance mechanism that the print tends to be smeared when the printing area is conveyed by the roller nip action because the nip roller makes contact with the printed surface of the paper immediately after printing. Therefore, the suction belt conveyance in which nothing comes into contact with the image surface in the printing area is preferable.

A heating fan 40 is disposed on the upstream side of the printing unit 12 in the conveyance pathway formed by the suction belt conveyance unit 22. The heating fan 40 blows heated air onto the recording paper 16 to heat the recording paper 16 immediately before printing so that the ink deposited on the recording paper 16 dries more easily.

The print unit 12 includes so-called "full line heads" in which a line head having a length corresponding to the maximum paper width is arranged in a direction (main scanning direction) that is perpendicular to the paper feed direction (sub-scanning direction). The heads 12K, 12C, 12M and 12Y forming the print unit 12 are constituted by line heads in which a plurality of ink ejection ports (nozzles) are arranged through a length exceeding at least one edge of the maximum size recording paper 16 intended for use with the inkjet recording apparatus 10.

The heads 12K, 12C, 12M, 12Y corresponding to respective ink colors are disposed in the order, black (K), cyan (C), magenta (M) and yellow (Y), from the upstream side (left-hand side in FIG. 1), following the direction of conveyance of the recording paper 16. A color print can be formed on the recording paper 16 by ejecting the inks from the heads 12K, 12C, 12M, and 12Y, respectively, onto the recording paper 16 while the recording paper 16 is conveyed.

The print unit 12, in which the full-line heads covering the entire width of the paper are thus provided for the respective ink colors, can record an image over the entire surface of the recording paper 16 by performing the action of moving the recording paper 16 and the print unit 12 relatively to each other in the paper conveyance direction just once (in other words, by means of a single sub-scan). Higher-speed printing is thereby made possible and productivity can be improved in comparison with a shuttle type head configuration in which a recording heads moves back and forth reciprocally in the main scanning direction, which is perpendicular to the paper conveyance direction.

Although a configuration with four standard colors, K, M, C and Y, is described in the present embodiment, the combinations of the ink colors and the number of colors are not limited to these, and light and/or dark inks can be added as required. For example, a configuration is possible in which heads for ejecting light-colored inks such as light cyan and light magenta are added.

As shown in FIG. 1, the ink storing and loading unit 14 has ink tanks for storing the inks of the colors corresponding to the respective heads 12K, 12C, 12M, and 12Y, and the respective tanks are connected to the heads 12K, 12C, 12M, and 12Y by means of channels (not shown). The ink storing and loading unit 14 has a warning device (for example, a display device, an alarm sound generator, or the like) for warning when the remaining amount of any ink is low, and has a mechanism for preventing loading errors among the colors.

The print determination unit 24 has an image sensor (line sensor) for capturing an image of the ink-droplet deposition result of the printing unit 12, and functions as a device to check for ejection defects such as clogs of the nozzles in the printing unit 12 from the ink-droplet deposition results captured and evaluated by the image sensor.

The print determination unit 24 of the present embodiment is configured with at least a line sensor having rows of photoelectric transducing elements with a width that is greater than the ink-droplet ejection width (image recording width) of the heads 12K, 12C, 12M, and 12Y. This line sensor has a color separation line CCD sensor including a red (R) sensor row composed of photoelectric transducing elements (pixels) arranged in a line provided with an R filter, a green (G) sensor row with a G filter, and a blue (B) sensor row with a B filter. Instead of a line sensor, it is possible to use an area sensor composed of photoelectric transducing elements which are arranged two-dimensionally.

The print determination unit 24 reads a test pattern image printed by the heads 12K, 12C, 12M, and 12Y for the respective colors, and the ejection of each head is determined. The ejection determination includes check of presence of the ejection, measurement of the dot size, and measurement of the dot deposition position.

A post-drying unit 42 is disposed following the print determination unit 24. The post-drying unit 42 is a device to dry the printed image surface, and includes a heating fan, for example. It is preferable to avoid contact with the printed surface until the printed ink dries, and a device that blows heated air onto the printed surface is preferable.

In cases in which printing is performed with dye-based ink on porous paper, blocking the pores of the paper by the application of pressure prevents the ink from coming in contact with ozone and other substances that cause dye molecules to break down, and has the effects of increasing the durability of the print.

A heating/pressurizing unit 44 is disposed following the post-drying unit 42. The heating/pressurizing unit 44 is a device to control the glossiness of the image surface, and the image surface is pressed with a pressure roller 45 having a predetermined uneven surface shape while the image surface is heated, and the uneven shape is transferred to the image surface.

The printed matter generated in this manner is outputted from the paper output unit 26. The target print (i.e., the result of printing the target image) and the test print are preferably outputted separately. In the inkjet recording apparatus 10, a sorting device (not shown) is provided for switching the outputting pathways in order to sort the printed matter with the target print and the printed matter with the test print, and to send them to paper output units 26A and 26B, respectively. When the target print and the test print are simultaneously formed in parallel on the same large sheet of paper, the test print portion is cut and separated by a cutter (second cutter) 48. The cutter 48 is disposed directly in front of the paper output unit 26, and is used for cutting the test print portion from the target print portion when a test print has been performed in the blank portion of the target print. The structure of the cutter 48 is the same as the first cutter 28 described above, and has a stationary blade 48A and a round blade 48B.

Although not shown in the drawings, the paper output unit 26A for the target prints is provided with a sorter for collecting prints according to print orders.

Structure of the Head

Next, the structure of the heads is described below. The heads 12K, 12C, 12M and 12Y of the respective ink colors have the same structure, and a reference numeral 50 is hereinafter designated to any of the heads.

Figure 3A:
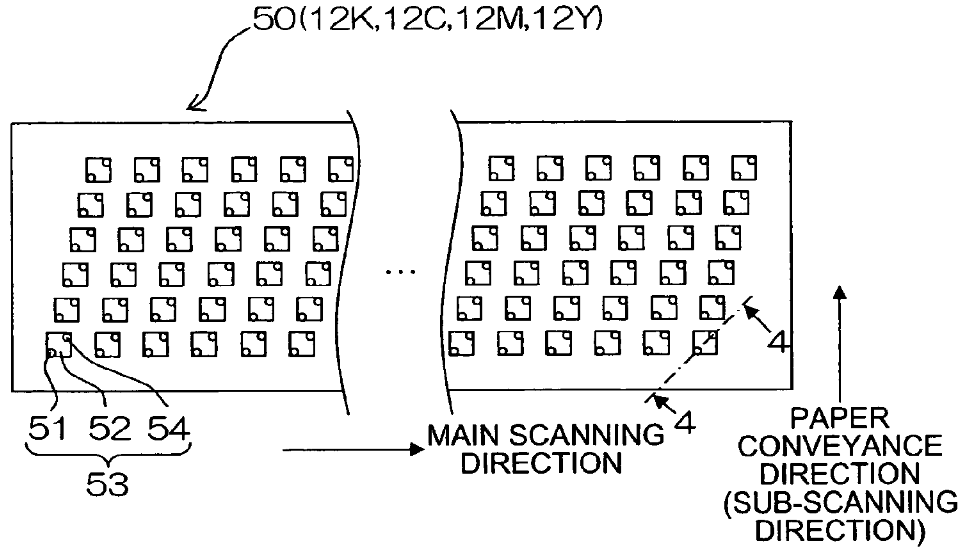
FIGS. 3A to 3C are plan view perspective diagrams showing embodiments of the composition of the head.
Figure 3B:
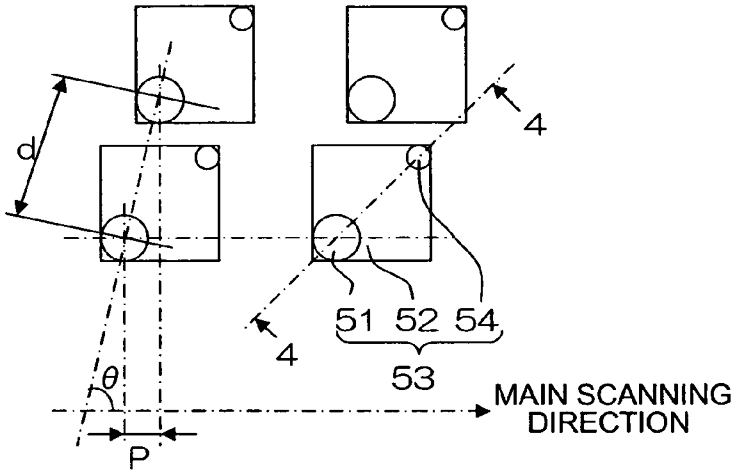
Figure 3C:
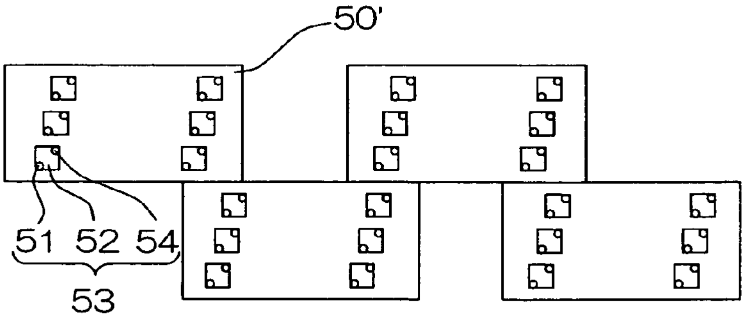

FIG. 3A is a perspective plan view showing an embodiment of the configuration of the head 50, FIG. 3B is an enlarged view of a portion thereof, and FIG. 3C is a perspective plan view showing another embodiment of the configuration of the head 50.

As shown in FIGS. 3A and 3B, the pressure chambers 52 provided corresponding to the nozzles 51 respectively have an approximately square-shape in plan view, and a nozzle 51 and a supply port 54 are provided respectively at either corner of a diagonal of the pressure chamber 52. The pressure chambers 52 are connected to a common flow channel (common liquid chamber), which is not shown, via supply ports 54, and when ink is ejected from a nozzle 51, then new ink is supplied to the corresponding pressure chamber 52 from the common flow channel, via the supply port 54.

The nozzle pitch in the head 50 should be minimized in order to maximize the density of the dots printed on the surface of the recording paper 16. As shown in FIGS. 3A to 3C, the head 50 according to the present embodiment has a structure in which a plurality of ink chamber units 53, each comprising a nozzle 51 forming an ink droplet ejection port, a pressure chamber 52 corresponding to the nozzle 51, and the like, are disposed two-dimensionally in the form of a staggered matrix, and hence the effective nozzle interval (the projected nozzle pitch) as projected in the lengthwise direction of the head (the main-scanning direction perpendicular to the paper conveyance direction) is reduced and high nozzle density is achieved.

The mode of forming one or more nozzle rows through a length corresponding to the entire width of the recording paper 16 in the main-scanning direction substantially perpendicular to the conveyance direction is not limited to the embodiment described above. For example, instead of the configuration in FIG. 3A, as shown in FIG. 3C, a line head having nozzle rows of a length corresponding to the entire width of the recording paper 16 can be formed by arranging and combining, in a staggered matrix, short head blocks 50' having a plurality of nozzles 51 arrayed in a two-dimensional fashion.

The present embodiment describes a mode in which the planar shape of the pressure chambers 52 is substantially a square shape, but the planar shape of the pressure chambers 52 is not limited to being a substantially square shape, and it is possible to adopt various other shapes, such as a substantially circular shape, a substantially elliptical shape, a substantially parallelogram (diamond) shape, or the like. Furthermore, the arrangement of the nozzles 51 and the supply ports 54 is not limited to the arrangement shown in FIGS. 3A to 3C, and it is also possible to arrange nozzles 51 substantially in the central region of the pressure chambers 52, or to arrange the supply ports 54 in the side walls of the pressure chambers 52.

As shown in FIG. 3B, the high-density nozzle head according to the present embodiment is achieved by arranging a plurality of ink chamber units in a lattice fashion based on a fixed arrangement pattern, in a row direction which coincides with the main scanning direction, and a column direction which is inclined at a fixed angle of θ with respect to the main scanning direction, rather than being perpendicular to the main scanning direction.

More specifically, by adopting a structure in which a plurality of ink chamber units 53 are arranged at a uniform pitch d in line with a direction forming an angle of θ with respect to the main scanning direction, the pitch P of the nozzles projected so as to align in the main scanning direction is d×cos θ, and hence the nozzles 51 can be regarded to be equivalent to those arranged linearly at a fixed pitch P along the main scanning direction. Such configuration results in a nozzle structure in which the nozzle row projected in the main scanning direction has a high nozzle density of up to 2,400 nozzles per inch.

When the present invention is implemented, the arrangement structure of the nozzles is not limited to the embodiments shown in the drawings, and it is also possible to apply various other types of nozzle arrangements, such as an arrangement structure having one nozzle row in the sub-scanning direction.

In a full-line head comprising rows of nozzles that have a length corresponding to the entire width of the image recordable width, the “main scanning” is defined as printing one line (a line formed of a row of dots, or a line formed of a plurality of rows of dots) in the width direction of the recording medium (main-scanning direction) by driving the nozzles in one of the following ways: (1) simultaneously driving all the nozzles; (2) sequentially driving the nozzles from one side toward the other; and (3) dividing the nozzles into blocks and sequentially driving the nozzles from one side toward the other in each of the blocks.

In particular, when the nozzles 51 arranged in a matrix such as that shown in FIGS. 3A to 3C are driven, the main scanning according to the above-described (3) is preferred.

On the other hand, “sub-scanning” is defined as to repeatedly perform printing of one line (a line formed of a row of dots, or a line formed of a plurality of rows of dots) formed by the main scanning, while the full-line head and the recording paper 16 are moved relatively to each other.

Figure 4A:
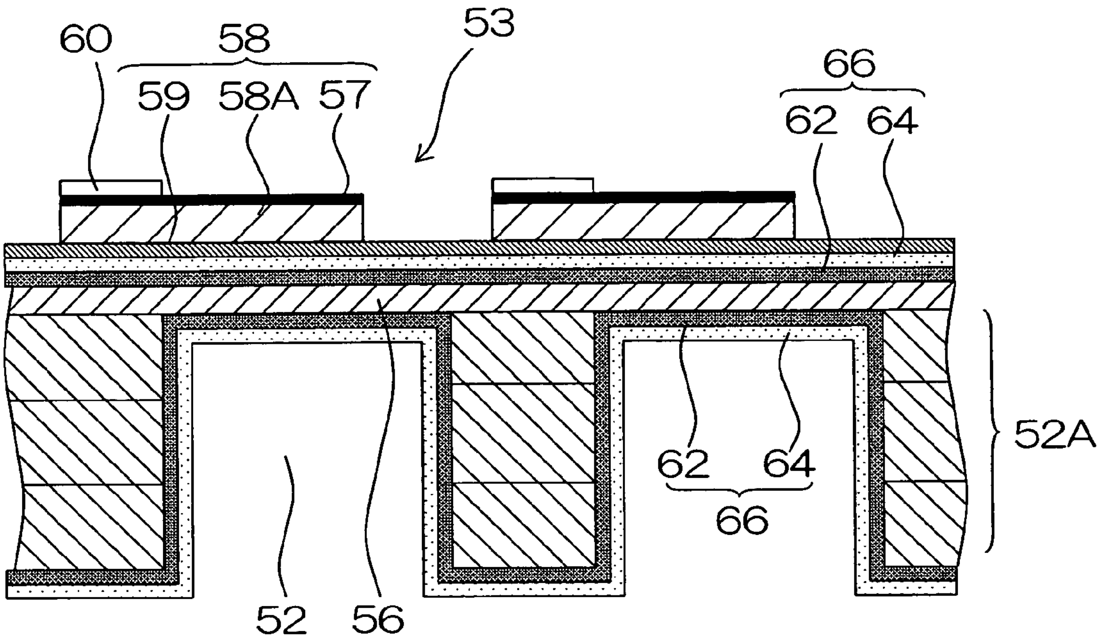
FIGS. 4A and 4B are diagrams showing the structure of the head shown in FIGS. 3A to 3C.
Figure 4B:
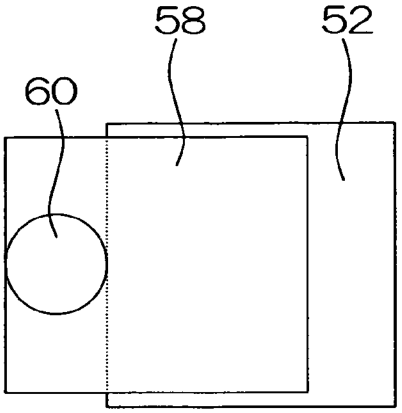

FIGS. 4A and 4B are cross-sectional diagrams showing the composition of the ink chamber unit 53 (a cross-sectional diagram along line 4-4 in FIGS. 3A and 3B). In FIGS. 4A and 4B, the nozzles 51 and the supply ports 54 shown in FIGS. 3A to 3C are omitted from the drawings.

The head 50 shown in the present embodiment has a laminated structure in which a plurality of cavity plates (substrates) are stacked. In other words, a pressure chamber formation substrate 52A having spaces which are to create pressure chambers 52 is composed of three substrates (substrates 100, 102 and 104 shown in FIGS. 6A to 6D) having a thickness of approximately 50 μm, and a diaphragm 56 forming ceilings of the pressure chambers 52 is stacked onto the pressure chamber formation substrate 52A. Moreover, piezoelectric elements 58 comprising individual electrodes (upper electrodes) 57 are arranged across the diaphragm 56 from the pressure chambers 52.

Each piezoelectric element 58 includes: a piezoelectric body 58A made of PZT (lead zirconate titanate), or the like; a common electrode (lower electrode) 59 which is provided on the lower surface of the piezoelectric body 58A (on the diaphragm 56 side); and an individual electrode 57 provided on the other surface of the piezoelectric body 58A (across the piezoelectric body 58A from the diaphragm 56).

A metal material (or a metal oxide material), such as iridium oxide ($IrO_2$), nickel (Ni), or gold (Au), is used for the individual electrodes 57, and a metal material, such as titanium (Ti) or iridium (Ir), is used for the common electrode 59. It is possible to use the same material for the individual electrodes 57 and the common electrode 59 or to use different materials for the individual electrodes 57 and the common electrode 59.

FIG. 4A illustrates an embodiment of a single-layer type of piezoelectric element which includes: a single-layer piezoelectric body 58A; and an individual electrode 57 and the common electrode 59 which are respectively provided on both sides of the piezoelectric body 58A. However, a piezoelectric element 58 may also have a laminated structure in which a plurality of piezoelectric bodies (piezoelectric layers) 58A and electrodes (individual electrodes 57 and common electrodes 59) are stacked alternately. In a mode where such a laminated structure of piezoelectric elements is adopted, it is possible to increase the amount of displacement of the diaphragm 56, in comparison with a mode where a single-layer type of piezoelectric body is used, when the same drive signal (drive voltage) is applied.

Moreover, as shown in FIG. 4B, an extraction electrode 60 for electrically bonding an individual electrode 57 to a wiring member (not shown) is formed in the portion corresponding to a pressure chamber partition wall for the individual electrode 57 (i.e., the portion which corresponds to the part where a pressure chamber 52 is not formed and the piezoelectric element 58 is not caused to deform).

In the present specification, a structure including a piezoelectric body 58A, an individual electrode 57 formed on one surface of the piezoelectric body 58A, and the common electrode 59 formed on the reverse surface of the piezoelectric body 58A, is referred to as a piezoelectric element 58.

By applying a prescribed drive voltage to a piezoelectric element 58 (i.e., between the individual electrode 57 and the common electrode 59), a bending deformation is generated in the piezoelectric element 58 and the diaphragm 56 is caused to deform by this bending deformation. When the pressure chamber 52 is deformed by operating the piezoelectric element 58, ink having the volume corresponding to the volume reduction of the pressure chamber 52 is ejected from the corresponding nozzle 51 as shown in FIG. 3A to 3C.

In this way, the structure including the diaphragm 56 and the piezoelectric elements 58 functions as piezoelectric actuators which convert the electrical energy (drive signal) applied to the piezoelectric elements 58 into the mechanical displacement (mechanical energy) of the diaphragm 56 (pressure chambers 52).

For the pressure chamber formation substrate 52A in which the pressure chambers 52 are formed and the diaphragm 56 constituting the ceilings of the pressure chambers 52, a heat-resistant stainless steel is used which is a ferrite material having a coefficient of linear expansion of $10\times10^{-6}$ ($^\circ$ C.$^{-1}$) to $14\times10^{-6}$($^\circ$ C.$^{-1}$), a chromium (Cr) content of 18% by weight or more, and an aluminum (Al) content of 2.5% by weight or more. Preferably, the diaphragm 56 has a thickness of approximately 15 μm, and in this case, a metal oxide film 66 which is provided with the diaphragm 56 has a thickness of 1.0 μm or less.

In this way, by forming the diaphragm 56 of a material having a coefficient of linear expansion which is close to the coefficient of linear expansion of the piezoelectric elements 58, it is possible to prevent warpage of the diaphragm 56 due to the high temperature when the piezoelectric elements 58 are calcined. Preferably, the diaphragm 56 has a coefficient of linear expansion of $8\times10^{-6}$($^\circ$ C.$^{-1}$) to $12\times10^{-6}$($^\circ$ C.$^{-1}$).

By ensuring that the coefficients of linear expansion of the pressure chamber formation substrate 52A and the diaphragm 56 are substantially the same, then warpage of the diaphragm 56 due to the high temperature in the calcination step described above or the other heat treatment steps is suppressed, and moreover it is possible to prevent detachment of the bonding region of the pressure chamber formation substrate 52A and the diaphragm 56.

As shown in FIG. 4A, the two-layer metal oxide film 66 including a chromium oxide film (for example, chromium oxide ($Cr_2O_3$)) 62 and an aluminum oxide film (for example, aluminum oxide ($Al_2O_3$)) 64 (which is arranged across the chromium oxide film 62 from the diaphragm 56) covering the chromium oxide film 62, is formed on each of the surface of the pressure chamber formation substrate 52A and the surface of the diaphragm 56 during the undermentioned oxide film formation process.

The metal oxide films 66 formed on the surface of the pressure chamber formation substrate 52A and the diaphragm 56 have a thickness of approximately 0.1 μm. Since an increase in the thickness of each metal oxide film 66 is equivalent to an increase in the thickness of the diaphragm 56, then, in a case where the diaphragm 56 has the increased thickness, there is a possibility that the prescribed amount of displacement of the diaphragm 56 is not obtained, even if a prescribed drive signal is applied to the piezoelectric elements 58. As described above, the diaphragm 56 according to the present embodiment has a thickness of approximately 15 μm, and the thickness of the metal oxide film 66 is accordingly set to 0.05 μm to 1.0 μm, thus guaranteeing a sufficient amount of displacement of the diaphragm 56.

According to the structure of the head 50 shown in FIGS. 4A and 4B, even when a calcination process (at a processing temperature of 600° C. to 800° C.) is carried out in a state where the piezoelectric elements 58 are bonded to the diaphragm 56, the iron (Fe) contained in the diaphragm 56 does not diffuse into the piezoelectric elements 58 (piezoelectric bodies 58A), and hence deterioration of the performance of the piezoelectric elements 58 and decline in the reliability of the piezoelectric elements 58 are prevented.

In a case where iron has diffused into the piezoelectric bodies 58A, when drive signals are supplied between the common electrode 59 and the individual electrodes 57, a leak current flows inside the piezoelectric bodies 58A due to the iron diffused into the piezoelectric bodies 58A, and hence the voltage applied between the individual electrodes 57 and the common electrode 59 declines. If there is a decline in the applied voltage in this way, then the amount of bending deformation of each piezoelectric element 58 becomes smaller, and consequently, the displacement of the diaphragm 56 also becomes smaller.

By raising the processing temperature in the calcination step, it is possible to further increase the piezoelectric d constant of the piezoelectric elements 58, and a mode is hence preferable which sets the processing temperature in the calcination step to the upper limit (in the present embodiment, 800° C.).

By harmonizing the coefficients of linear expansion of the diaphragm 56 and the piezoelectric elements 58, it is possible to suppress the warpage of the diaphragm 56 due to a high temperature during the calculation process described above. Moreover, by adopting the common material for the pressure chamber formation substrate 52A and the diaphragm 56, it is possible to combine the step of bonding the substrates constituting the pressure chamber formation substrate 52A, and the step of bonding the pressure chamber formation substrate 52A to the diaphragm 56, and furthermore the above-described bonds may not be necessary. Furthermore, it is also possible to prevent detachment between the pressure chamber formation substrate 52A and the diaphragm 56 due to the high temperature after bonding of the pressure chamber formation substrate 52A and the diaphragm 56.

Furthermore, the metal oxide film 66 is also formed in the inside of the pressure chambers 52 (including the portions of the diaphragm 56 forming the ceiling faces of the pressure chambers 52). The metal oxide film 66 inside the pressure chambers 52 functions as a protective film which protects the pressure chambers 52 and the diaphragm 56 from the ink.

The nozzles 51, which are omitted from FIGS. 4A and 4B, are provided in the surface which is formed across the pressure chambers 52 from the diaphragm 56 (the surface which opposes the diaphragm 56). A nozzle plate that has nozzles 51 corresponding to the plurality of pressure chambers 52 of the head 50 is bonded to the surface of the pressure chamber formation substrate 52A which is reverse to the surface that is bonded to the diaphragm 56, and thereby the nozzles 51 are connected with the pressure chambers 52 respectively.

A mode is also possible in which the nozzles 51 are connected with the pressure chambers 52 via nozzle flow channels. These nozzle flow channels may be constituted by a plurality of tubing channels having different diameters. Furthermore, a mode is also possible in which a process is carried out in such a manner that the vicinity of each nozzle 51 (each opening section) is formed in the shape of a taper.

Furthermore, supply ports 54 (not shown in FIGS. 4A and 4B) may be provided in the portions of the diaphragm 56 which correspond with parts where the piezoelectric elements 58 are not formed, and a common flow chamber which supplies ink to the pressure chambers 52 via the supply ports 54 may be provided across the diaphragm 56 from the pressure chambers 52.

In other words, in a structure where ink is supplied to the pressure chambers 52 from the common liquid chamber formed across the diaphragm 56 from the pressure chambers 52, via the supply ports 54 formed in the diaphragm 56, it is possible to shorten the flow channel length (to reduce the flow channel resistance) on the supplying side without making the size (volume) of the pressure chambers 52 smaller and hence improvement in the refilling characteristics can be expected, in comparison with a mode where the pressure chambers 52 and the common liquid chamber are provided across the diaphragm 56 from the piezoelectric elements 58.

Description of Control System

Figure 5:
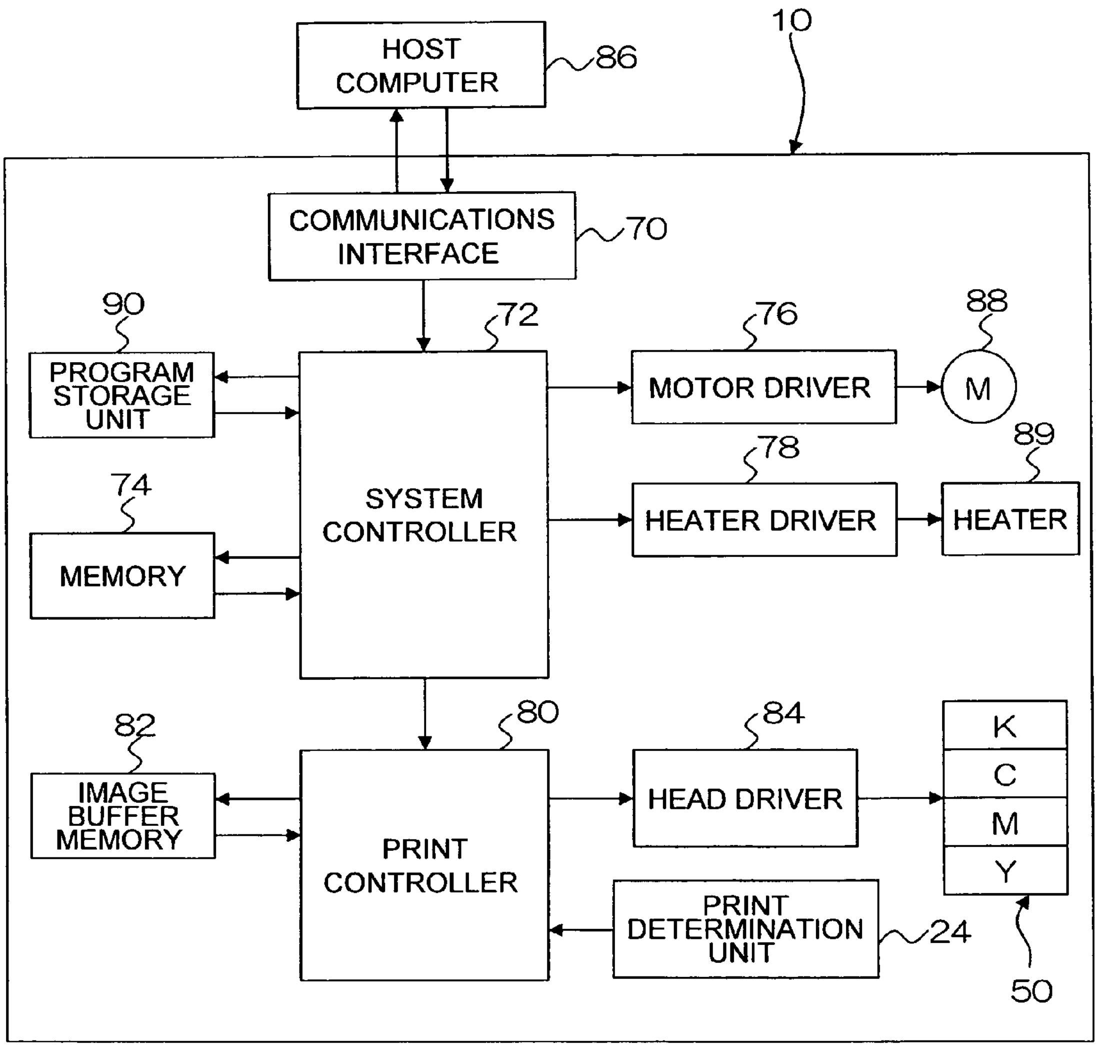
FIG. 5 is a principal block diagram showing the system configuration of the inkjet recording apparatus shown in FIG. 1.

FIG. 5 is a principal block diagram showing a system configuration of the inkjet recording apparatus 10. The inkjet recording apparatus 10 comprises a communications interface 70, a system controller 72, a memory 74, a motor driver 76, a heater driver 78, a print controller 80, an image buffer memory 82, a head driver 84, and the like.

The communications interface 70 is an interface unit for receiving image data sent from a host computer 86. A serial interface including USB (Universal serial bus), IEEE1394, Ethernet (registered trademark), wireless network, and a parallel interface such as a Centronics interface, may be used as the communications interface 70. A buffer memory (not shown) may be mounted in this portion in order to increase the communication speed. The image data sent from the host computer 86 is received by the inkjet recording apparatus 10 through the communications interface 70, and is temporarily stored in the memory 74. The memory 74 is a storage device for temporarily storing images inputted through the communications interface 70, and data is written and read to and from the memory 74 through the system controller 72. The memory 74 is not limited to a memory composed of semiconductor elements, and a hard disk drive or another magnetic medium may be used.

The system controller 72 is a control unit for controlling the various sections, such as the communications interface 70, the memory 74, the motor driver 76, the heater driver 78, and the like. The system controller 72 is constituted by a central processing unit (CPU) and peripheral circuits thereof, and the like, and in addition to controlling communications with the host computer 86 and controlling reading and writing from and to the memory 74, and the like, it also generates control signals for controlling the motor 88 of the conveyance system and the heater 89.

The motor driver (drive circuit) 76 drives the motor 88 in accordance with commands from the system controller 72. The heater driver (drive circuit) 78 drives the heater 89 of the post-drying unit 42 (shown in FIG. 1) and the like in accordance with commands from the system controller 72.

The print controller 80 has a signal processing function for performing various tasks, compensations, and other types of processing for generating print control signals from the image data stored in the memory 74 in accordance with commands from the system controller 72 so as to supply the generated print control signal to the head driver 84. Required signal processing is carried out in the print controller 80, and the ejection amount and the ejection timing of the ink droplets from each of the print heads 50 are controlled via the head driver 84, on the basis of the print data. By this means, desired dot size and dot positions can be achieved.

The print controller 80 is provided with the image buffer memory 82; and image data, parameters, and other data are temporarily stored in the image buffer memory 82 when image data is processed in the print controller 80. The mode shown in FIG. 5 is one in which the image buffer memory 82 accompanies the print controller 80; however, the memory 74 may also serve as the image buffer memory 82. Also possible is a mode in which the print controller 80 and the system controller 72 are integrated to form a single processor.

The head driver 84 drives the piezoelectric elements 58 of the heads of the respective colors 12K, 12C, 12M and 12Y on the basis of print data supplied by the print controller 80. The head driver 84 can be provided with a feedback control system for maintaining constant drive conditions for the print heads.

Various control programs are stored in a program storage section 90, and the control program is read out and executed in accordance with commands from the system controller 72. For the program storage section 90, a semiconductor memory, such as a ROM, EEPROM, or a magnetic disk, or the like may be used. Further, an external interface may be provided, and a memory card or PC card may also be used. Naturally, a plurality of these storage media may also be provided. The program storage section 90 may also be combined with a recording device (not shown) for storing operational parameters, or the like.

The print determination unit 24 is a block that includes the line sensor as described above with reference to FIG. 1, reads an image printed on the recording paper 16, determines the print conditions (presence of the ejection, variation in the dot formation, and the like) by performing desired signal processing, or the like, and provides determination results of the print conditions to the print controller 80. According to requirements, the print controller 80 makes various corrections with respect to the head 50 on the basis of information obtained from the print determination unit 24.

The system controller 72 and the print controller 80 may be constituted by one processor, and it is also possible to use a device which integrates the system controller 72, the motor driver 76, and the heater driver 78, into a single device, or a device which integrates a print controller 80 and the head driver into a single device.

Description of Head Manufacturing Method

Next, a method of manufacturing the head 50 is described below with reference to FIGS. 6A to 7.

Firstly, three substrates 100, 102 and 104 which are formed by heat-resistant stainless steel plates etched into the shape of pressure chambers, and a diaphragm 56 of heat-resistant stainless steel are prepared. Each of the substrates 100, 102 and 104 has a thickness of approximately 50 μm, and the diaphragm 56 has a thickness of approximately 15 μm.

Figure 6A:
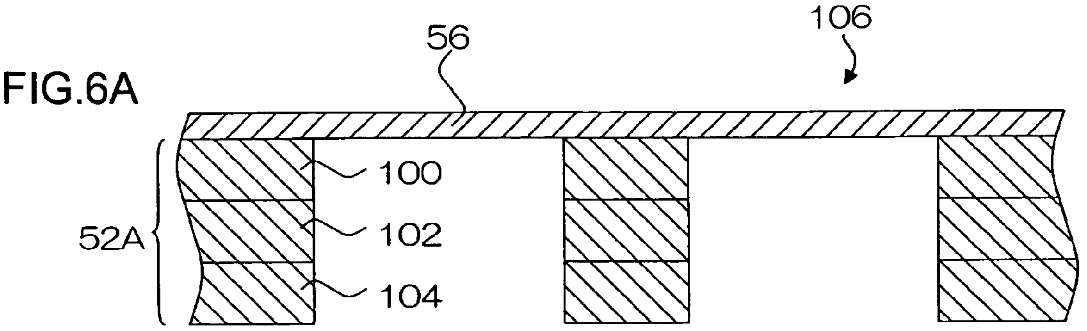
FIGS. 6A to 6D are diagrams showing steps of manufacturing a head according to an embodiment of the present invention.
Figure 7:
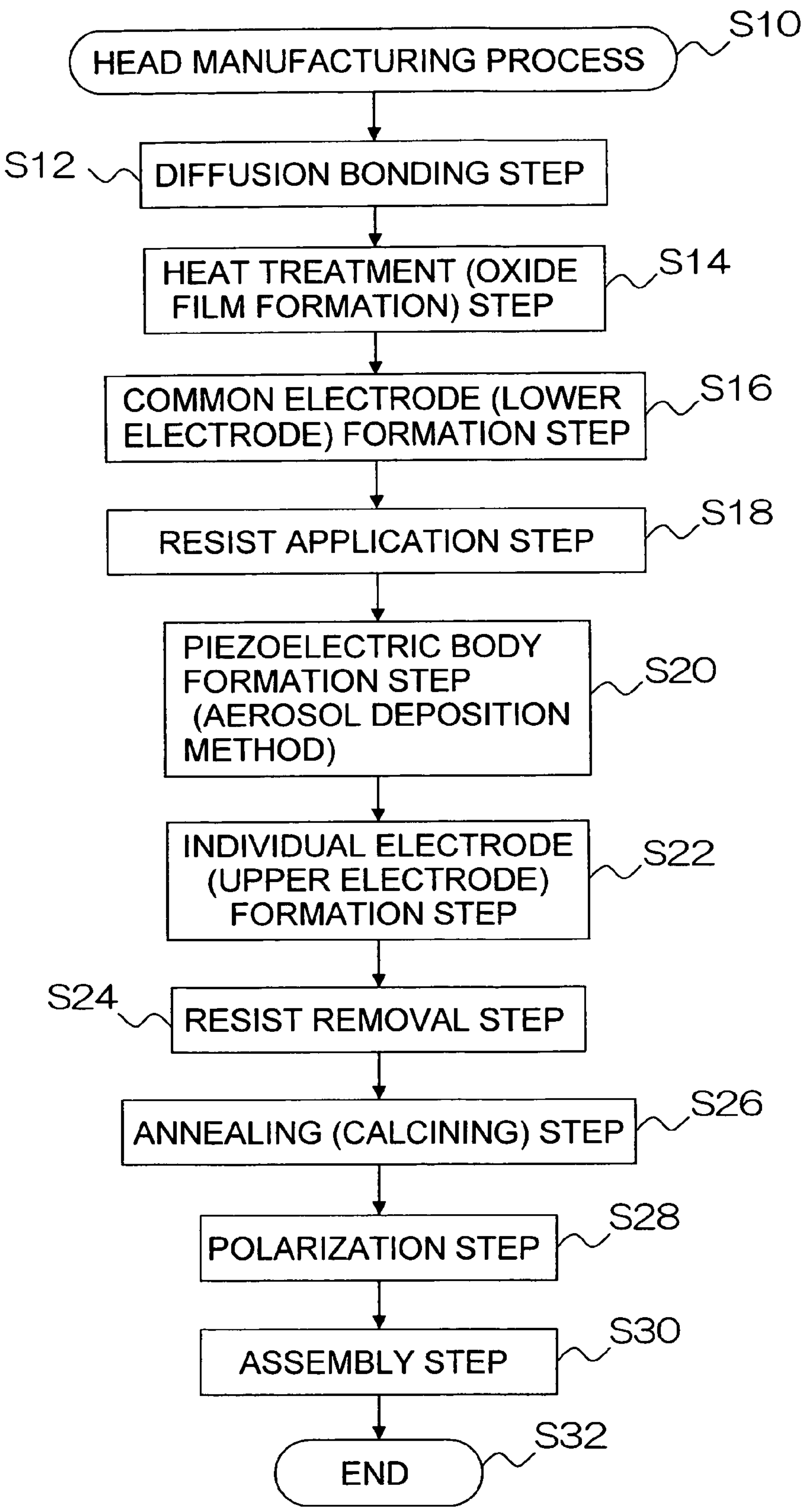
FIG. 7 is a process flowchart showing process of manufacturing a head according to an embodiment of the present invention.

As shown in FIG. 6A, the diaphragm 56 and the three substrates 100, 102 and 104 are jointed by the diffusion bonding method under temperature conditions of 900° C. to 1100° C. in a vacuum, and thus a laminated body 106 including the diaphragm 56 and the pressure chamber formation substrate 52A is formed (step S12 in FIG. 7).

Although FIG. 6A is a diagram showing an embodiment of substrates 100, 102 and 104 which are etched into substantially the same shape, the substrates 100, 102 and 104 may also be etched into mutually different shapes. Furthermore, the substrates 100, 102 and 104 may also have mutually different thicknesses.

Figure 6B:
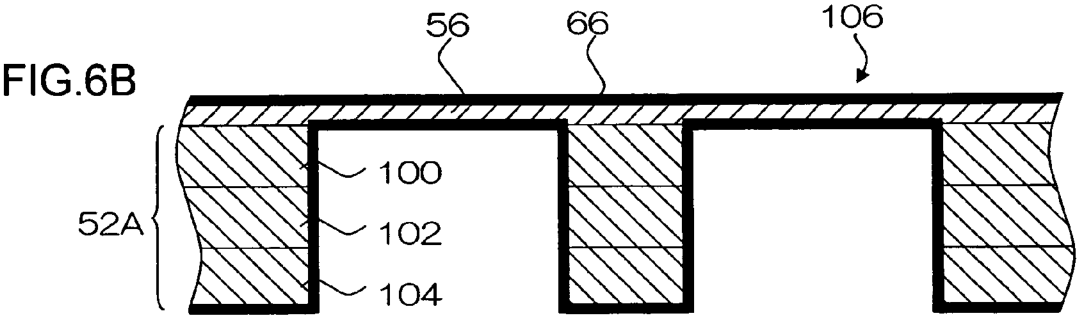

Then, by pre-annealing the laminated body 106 shown in FIG. 6A in the atmosphere (air containing oxygen) at temperature conditions of 600° C. to 1200° C., the metal oxide film 66 is grown on the surfaces of the heat-resistant stainless steel (the surface of the diaphragm on which the piezoelectric elements are disposed and the inner wall surface of the pressure chambers 52) as shown in FIG. 6B (step S14 in FIG. 7). The metal oxide film 66 is composed of $Cr_2O_3$ and $Al_2O_3$, in which an $Al_2O_3$ film (reference numeral 64 in FIG. 4A) grows on each surface of the heat-resistant stainless steel (the underlying substrate), and the growth of the $Al_2O_3$ film terminates when all of the aluminum has been expended by the oxidation process. Thereafter, the $Cr_2O_3$ film (reference numeral 62 in FIG. 4A) grows between the heat-resistant stainless steel and the $Al_2O_3$ film. The metal oxide film 66 formed in this way is a two-layer structure including the $Al_2O_3$ film and the $Cr_2O_3$ film.

Figure 6C:
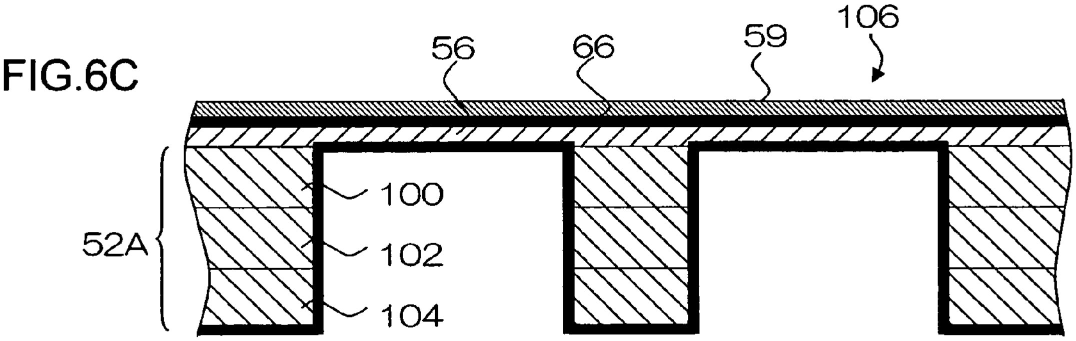

The metal oxide films 66 are formed on the pressure chamber formation substrate 52A and the diaphragm 56 as shown in FIG. 6B, and then a metal film forming the common electrode 59 is deposited by sputtering onto the surface (i.e., the surface on which the piezoelectric elements are disposed) of the diaphragm 56 reverse to the surface on which the pressure chambers 52 are formed, as shown in FIG. 6C (step S16 in FIG. 7).

Figure 6D:
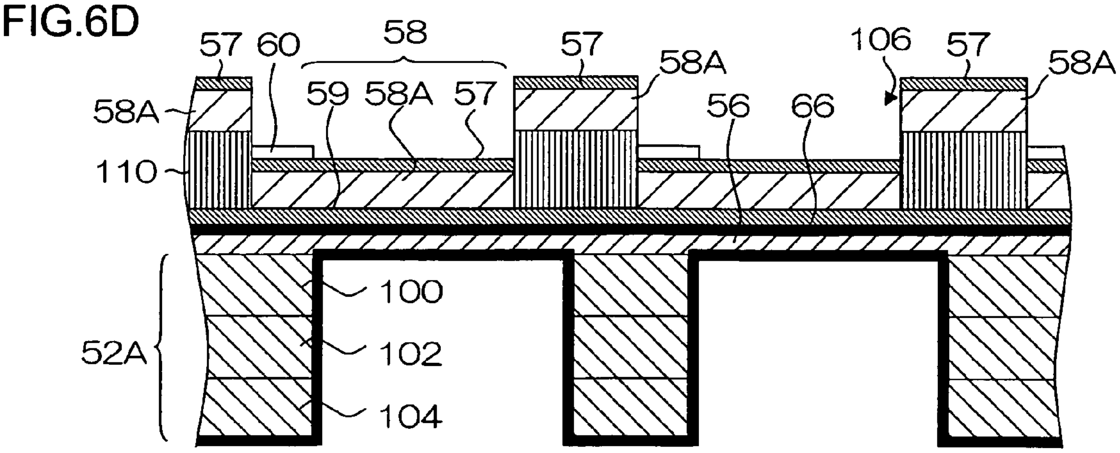

The common electrode 59 is formed on the surface of the diaphragm 56 on which the piezoelectric elements are disposed as shown in FIG. 6C, and then piezoelectric bodies 58A are formed at positions corresponding to the pressure chambers 52, as shown in FIG. 6D, under the conditions of normal temperature (or at 600° C.).

Under normal temperature conditions, the piezoelectric elements 58 are deposited selectively by the lift-off method. In other words, the portions where the piezoelectric elements 58 are not to be disposed are masked with resist 110 (dry film resist) (step S18 in FIG. 7), and piezoelectric bodies 58A are formed onto the portions which have not been masked with the resist 110 (step S20). It is suitable to use the aerosol deposition method (AD method) as the method of depositing the piezoelectric bodies 58A.

The piezoelectric bodies 58A is deposited in this way, and then thin films of metal (metal oxide) forming the individual electrodes 57 is deposited by sputtering, and extraction electrodes 60 are also deposited (step S22 in FIG. 7), whereupon the resist 110 is removed by using an alkali solution (step S24).

As shown in FIG. 6D, the piezoelectric elements 58 each including an individual electrode 57 (extraction electrode 60), a piezoelectric body 58A, and the common electrode 59, are formed across the diaphragm 56 from the pressure chambers 52. Thereupon, annealing (calcination) is carried out under temperature conditions of 600° C. to 800° C., thereby calcining the piezoelectric bodies 58A (step S26).

The piezoelectric bodies 58A can also be formed as follows: a film forming a piezoelectric body 58A is deposited over the whole surface of the common electrode 59, and after the annealing process, the deposited film is divided into the piezoelectric bodies 58A by dry etching in such a manner that the piezoelectric bodies 58A have a shape corresponding to the pressure chambers 52 (dividing process).

As shown in FIG. 6D, the piezoelectric elements 58 are formed on the surface of the diaphragm 56 that is the surface to be provided with the piezoelectric bodies, and then a polarization process is carried out with respect to the piezoelectric elements 58 (step S28 in FIG. 7), and an assembly step of bonding the nozzle plate, and the like, is then carried out (step S30), thereby obtaining the head 50 (step S32).

FIG. 8 is a table showing experimental results for iron diffusion depending on materials of the diaphragm 56. As shown in FIG. 8, the experiment was carried out under the conditions that: various materials, namely SUS304, SUS430 (both of which are types of stainless steel with no aluminum content), and materials A, B, C, D (heat-resistant stainless steels containing chromium and aluminum) are used as the diaphragm 56; an annealing process was implemented at a processing temperature of 600° C. or 800° C. in the situation where the piezoelectric elements 58 were formed onto the diaphragm 56; and an EDX (composition analyzer) was then used for evaluating whether or not iron diffusion into the piezoelectric bodies 58A had occurred.

In FIG. 8, a sign of "good" in the iron diffusion judgment column (i.e., "Fe DIFFUSION EVALUATION" column) denotes that iron diffusion had not occurred, and a sign of "poor" in the same column denotes that iron diffusion had occurred.

As shown in FIG. 8, when the SUS304 (chromium content of 18 to 20 wt % (weight percentage)) and the SUS 430 (chromium content of 16 to 18 wt %), both of which contain chromium but do not contain aluminum, were subjected to annealing at a temperature of 600° C., there was diffusion of iron into the piezoelectric bodies 58A. On the other hand, when the material A which contains chromium and aluminum (chromium content 18 to 20 wt % and aluminum content 2.5 wt %) was subjected to annealing at a temperature of 600° C., diffusion of the iron into the piezoelectric bodies 58A did not occur. However, when the material A was annealed at a temperature of 800° C., diffusion of iron into the piezoelectric bodies 58A did occur as shown in FIG. 8.

Moreover, as shown in FIG. 8, in the cases of the materials B, C and D, there was no diffusion of iron into the piezoelectric bodies 58A, even when the materials were subjected to annealing at a temperature of 800° C.

In other words, in the case of the material A, which has a chromium content of 18 wt % to 20 wt %, and an aluminum content of 2.5 wt %, diffusion of iron into the piezoelectric bodies 58A did occur when annealing was carried out at a temperature of 800° C., whereas diffusion of iron into the piezoelectric bodies 58A did not occur when the material was subjected to annealing at a temperature of 600° C.

In the case of the material B which has a chromium content of 18 wt % and an aluminum content of 2.98 wt %, even when annealing was carried out at a temperature of 800° C., diffusion of iron into the piezoelectric bodies 58A did not occur. Furthermore, in the case of the material C which has a chromium content of 19 wt % to 21 wt % and an aluminum content of 4.5 wt % to 6 wt %, and in the case of the material D which has a chromium content of 19.5 wt % to 20.5 wt % and an aluminum content of 4.8 wt % to 5.25 wt %, even when annealing was carried out at a temperature of 800° C., diffusion of iron into the piezoelectric bodies 58A did not occur.

In other words, in the case of the annealing temperature is 600° C., if a heat-resistant stainless steel having a chromium content of 18 wt % or above and an aluminum content of 2.5 wt % or above is used for the diaphragm 56, the iron contained in the diaphragm 56 does not diffuse into the piezoelectric bodies 58A.

Furthermore, in the case of the annealing temperature is 800° C., if a heat-resistant stainless steel having a chromium content of 18 wt % or above and an aluminum content of 2.98 wt % or above is used for the diaphragm 56, the iron contained in the diaphragm 56 does not diffuse into the piezoelectric bodies 58A. In other words, a more preferable mode is one in which the temperature conditions of the annealing step shown in FIG. 7 are set to 800° C., and a heat-resistant stainless steel having a chromium content of 18 wt % or above and an aluminum content of 2.98 wt % or above is used for the diaphragm 56.

In the inkjet recording apparatus 10 having the composition described above, in a case where a heat-resistant stainless steel which is a ferrite material and has a chromium content of 18 wt % or above and an aluminum content of 2.5 wt % or above is adopted as the material of the diaphragm 56, even if a heat treatment is carried out at a temperature of 600° C. or below, there is no diffusion into the piezoelectric bodies 58A of the iron contained in the diaphragm 56, and therefore it is possible to prevent deterioration in the performance of the piezoelectric bodies 58A (piezoelectric elements 58).

Furthermore, in comparison with a case where a protection film (metal oxide film) is formed between the diaphragm 56 and the piezoelectric elements 58, it is possible to obtain an iron diffusion preventing effect without increasing the thickness of the diaphragm 56. Moreover, since an oxide film is formed uniformly over the whole surface of the diaphragm 56, then there are no concerns regarding warpage of the diaphragm 56 and hence cost reductions can be expected.

Although, in the present embodiment, an inkjet recording apparatus which forms a prescribed image by ejecting ink toward the recording medium 16 is described, the present invention can also be applied to a liquid ejection apparatus which ejects liquid (such as treatment liquid, chemical solution, water, or the like) onto a medium.

Although the present embodiment is described with respect to a full line type of head, the present invention may also be applied to a serial type of head which carries out printing in the breadthways direction of a recording medium by ejecting ink while scanning in the breadthways direction of the recording medium.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of manufacturing a piezoelectric actuator, comprising the steps of:

carrying out a first heat treatment of a diaphragm of stainless steel containing iron, chromium and aluminum, in a gas containing oxygen, so as to form an aluminum oxide film on a first surface of the diaphragm and form a chromium oxide film between the aluminum oxide film and the first surface of the diaphragm;

forming a lower electrode on the aluminum oxide film;

forming a piezoelectric body on a surface of the lower electrode reverse to a surface of the lower electrode on which the chromium oxide film and the aluminum oxide film are formed;

forming an upper electrode on a surface of the piezoelectric body reverse to a surface of the piezoelectric body on which the lower electrode is formed; and calcining the piezoelectric body by carrying out a second heat treatment of the diaphragm with which the piezoelectric body is provided.

2. The method of manufacturing a piezoelectric actuator as defined in claim 1, wherein the first heat treatment of the diaphragm is carried out in the gas, in such a manner that another aluminum oxide film is also formed on a second surface of the diaphragm reverse to the first surface and another chromium oxide film is also formed between the aluminum oxide film and the second surface of the diaphragm.

3. The method of manufacturing a piezoelectric actuator as defined in claim 1, wherein:

the diaphragm has a chromium content of 18 weight percent or above, and an aluminum content of 2.5 weight percent or above; and the piezoelectric body is calcined by carrying out the second heat treatment under temperature conditions of not less than 600° C. and below 800° C.

4. The method of manufacturing a piezoelectric actuator as defined in claim 1, wherein:

the diaphragm has a chromium content of 18 weight percent or above, and an aluminum content of 2.98 weight percent or above; and the piezoelectric body is calcined by carrying out the second heat treatment under temperature conditions of not less than 800° C.

5. The method of manufacturing a piezoelectric actuator as defined in claim 1, wherein the chromium oxide film contains chromium oxide and the aluminum oxide film contains aluminum oxide.

6. The method of manufacturing a piezoelectric actuator as defined in claim 1, wherein the diaphragm includes a ferrite stainless steel substrate.

7. The method of manufacturing a piezoelectric actuator as defined in claim 1, wherein the piezoelectric body is formed by aerosol deposition.

* * * * *